March 24, 1964 A. D. REICH 3,125,860

THERMOELECTRIC COOLING SYSTEM

Filed July 12, 1962

Inventor:
Allen D. Reich
By: Lyle S. Motley Atty.

United States Patent Office 3,125,860

Patented Mar. 24, 1964

3,125,860

THERMOELECTRIC COOLING SYSTEM

Allen D. Reich, Des Plaines, Ill., assignor to Borg-Warner Corporation, Chicago, Ill., a corporation of Illinois Filed July 12, 1962, Ser. No. 209,328

4 Claims. (Cl. 62—3)

This invention relates to a thermoelectric cascade cooling system effective to develop very low temperatures for point cooling.

More particularly, this invention relates to a thermoelectric cascade cooling device which may be used to cool infrared detectors to very low temperatures and thereby improve the signal-to-noise ratio of the infrared cell. In previous devices, liquid nitrogen or other cryogenic means have been employed to cool the infrared cells.

In order to produce very low temperatures with thermoelectric devices, a cascade network or a plurality of stages is necessary because the difference in temperature produced across each stage is not sufficient to lower the temperature to the desired level. The invention contemplates that a plurality of stages will be employed and that the cold junctions of the couples of a successive stage shall be used as current sources for the upper or colder stages. Such a provision eliminates the need for the usual separate leads to the colder stages as well as the associated heat drain through these leads.

It is an object of the present invention to produce a cascade cooling system effective to produce either a maximum temperature difference for a given power input, or the highest possible efficiency for a given temperature difference.

It is a more particular object to provide an improved cooling device employing a plurality of thermoelectric elements or arms which are connected thermally in a series of stages, and electrically in a series parallel network.

The first principal controlling factor to be taken into account is the determination of the number of stages, the pumping capacities, the arm voltages, and the temperature differentials of the stages. These parameters are determined by optimizing the stage currents and the ratios of adjacent stage pumping capacities for maximum temperature differential, by optimizing the temperature distribution for maximum efficiency. The second controlling factor is the realization of these requirements for each stage. This second requirement is achieved by means of the following:

(1) The selected number of elements placed in series with elements of an adjacent stage is chosen to give the optimum arm voltage.

(2) The area of the elements is chosen to maintain the required voltages in the presence of additional current being supplied to adjacent colder stages.

(3) The total area of the elements is selected to give the proper heat pumping capacity for each stage.

Other objects and features of advantage of the present invention will be found throughout the following more detailed description of the invention, particularly when considered with the accompanying drawings in which like reference characters refer to similar elements.

Figure 2:
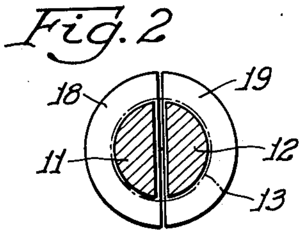
FIG. 2 is a view taken on line 2—2 of FIG. 1.
Figure 1:
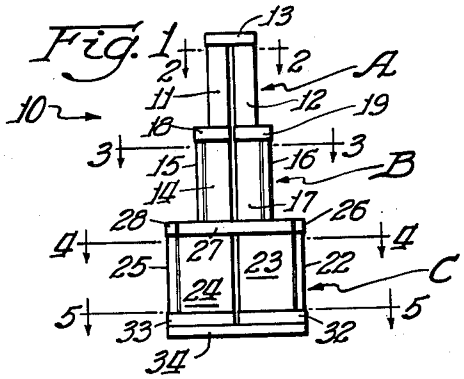
FIG. 1 is a side view of an embodiment of the present invention.
Figure 3:
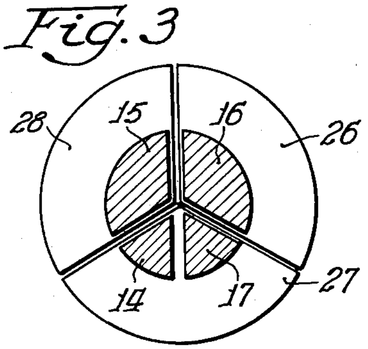
FIG. 3 is a view taken on line 3—3 of FIG. 1.
Figure 6:
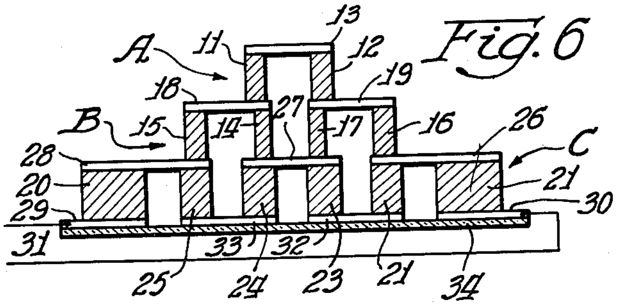
FIG. 6 is a schematic diagram of the thermal and electrical network of the embodiment of FIG. 1.
Figure 4:
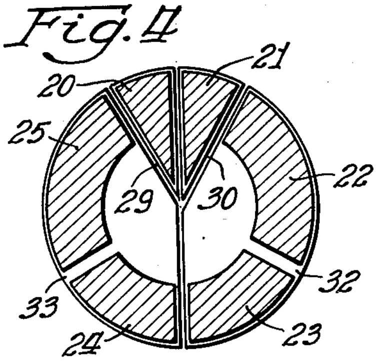
FIG. 4 is a view taken on line 4—4 of FIG. 1.

Referring to the drawings, the cascade thermoelectric cooling device of FIG. 1 is designated generally by the numeral 10 and comprises three stages designated by the letters A, B, and C. Stage A is the coldest stage; stage B is the intermediate stage; and stage C is the final cooling stage.

Stage A comprises two thermoelectric elements 11 and 12 of a generally semi-cylindrical construction. The upper ends of the elements 11 and 12 are bridged by an electrical conductor 13 which may be made of copper.

Stage B comprises four thermoelectric elemnts 14, 15, 16 and 17. The upper ends of the elements 14 and 15 are bridged by conductor 18 and the upper ends of the elements 16 and 17 are bridged by a conductor 19.

Stage C comprises six thermoelectric elements 20, 21, 22, 23, 24, and 25. The upper ends of the elements 21 and 22 are bridged by a conductor 26. The upper ends of the elements 23 and 24 are bridged by a conductor 27; and the upper ends of the elements 20 and 25 are bridged by a conductor 28. The lower end of element 20 is attached to a conductor 29, and the lower end of element 21 is attached to a conductor 30. The conductors 29 and 30 are connected electrically to the terminals of a D.C. source represented by numeral 31. The lower ends of elements 22 and 23 are bridged by a conductor 32 and the lower ends of elements 24 and 25 are bridged by a conductor 33. The conductors 29, 30, 32 and 33 are supported on a thermally conductive but electrically insulating base 34.

Figure 7:
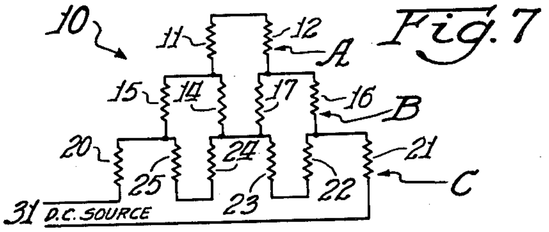
FIG. 7 is a schematic diagram of the electrical network wherein each of the thermoelectric elements are shown as resistors.

FIG. 7 shows the thermoelectric elements or arms represented as electrical resistances. The elements are connected in a series parallel network as shown to a D.C. source 31.

Figures 5, 8:
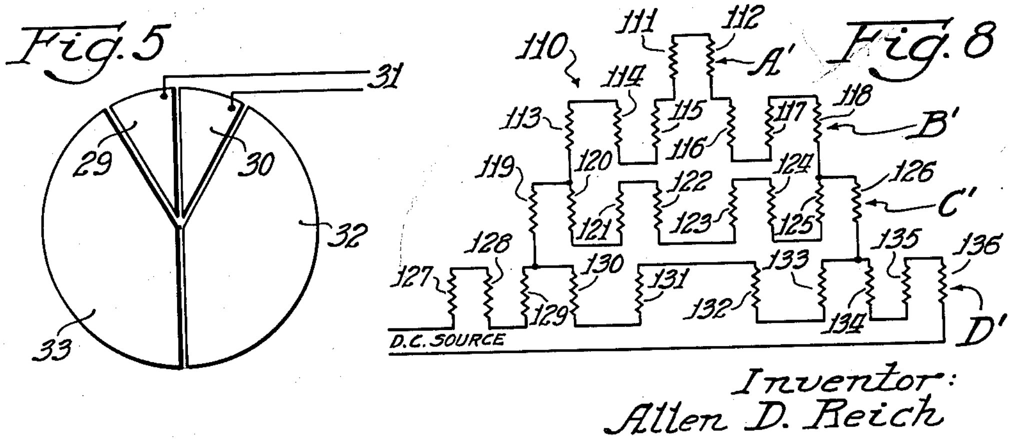
FIG. 5 is a view taken on line 5—5 of FIG. 1.
FIG. 8 is a schematic diagram of a modification of the electrical network of FIG. 7.

Referring to FIG. 8, there is illustrated a schematic diagram of the electrical network of a thermoelectric device having four stages, designated A′, B′, C′ and D′. Stage A′ includes elements 111 and 112; stage B′ includes elements 113 through 118; stage C′ includes elements 119 through 126; and stage D′ includes elements 127 through 136. The physical structure of the embodiment of FIG. 8 may be substantially similar to that shown in FIGS. 1 through 5.

The method set forth hereinafter is applicable to both embodiments, but is more generally demonstrated in connection with FIG. 8.

By way of enlargement, the first principal controlling factor of determining the number of stages, pumping capacities, and arm voltages for achieving maximum temperature differential, is determined by writing the equation for the cold junction temperature of the system in terms of the current of the stages and the ratio of the pumping capacities of adjacent stages. From this, the optimum current, the optimum pumping capacity ratios, and the optimum number of stages are determined to make the temperature differential a maximum for a given ratio of input and output powers. From the load of the system, the pumping capacities may then be determined, and from the equations for the individual stages, the temperature differentials and arm voltages may be determined.

The requirement for achieving the maximum efficiency of the system is met by requiring that the ratio of the temperature differential of the stage to the square of the cold junction temperature of the stage be a constant. Expressed mathematically, $$\frac{\Delta T}{T^2} = \text{Const.} \qquad \text{(I)}$$

where ΔT is the temperature differential and T is the cold junction temperature. This leads to an optimum temperature distribution for the system as given by $$T_c(a)=\frac{T_h}{1+\frac{\Delta T_t}{NT_c}a} \quad \text{(II)}$$

where $T_h$ and $T_c(a)$ are the hot and cold junctions of the $a$ stage, N is the total number of stages and $\Delta T_t$ is the total temperature differential across which the system operates. N is subsequently chosen to maximize the efficiency. When Equation II is applied to each stage, the temperature differentials of the stages are determined. Also, by applying the individual stage equations, the pumping capacities and arm voltages for the stages are determined.

The optimum stage pumping capacities, temperature differentials, and arm voltages for achieving either maximum temperature differentials or maximum efficiency are determined by choosing the number of couples, and the cross sectioned areas of these couples, to give the required voltages and pumping capacities, while at the same time to provide current to adjacent, colder stages.

To illustrate these general considerations, refer specifically to stage C′ of FIG. 8. Arms 119 and 126 are the outer arms, and arms 120 through 125 are the inner arms. To meet the electrical requirements, the cross sectional areas of the outer arms are larger with respect to the inner arms by a sufficient amount to pass current to stages B′ and A′, while assuring the same voltage drop across each of the arms of stage C′. This proper choice of areas decreases the resistance of the outer arms and increases the resistance of the inner arms. The total area of all of the arms, however, must also be selected to give the required pumping capacity for stage C′. When this is achieved, all of the arms pump at their optimum voltage values and the optimum overall pumping capacity for that stage is also realized.

The resistance of the thermoelectric elements illustrated in FIG. 8 is a function of the length of the element, its cross sectional area, and its resistivity. The resistivity for a particular thermoelectric material is constant. The resistance for each element can therefore be varied by either varying the length or the cross sectional area of the elements, or both.

The actual physical size of the elements employed will generally be determined or limited by the power available and by the application for which the device is intended, as well as cost and space requirements.

In practice, it has been found that the desired optimum physical construction can be more conveniently arrived at by varying the area rather than varying the length of the elements. The following method or procedure could be executed by keeping the length of the element constant and varying the area of each element to satisfy the requirements herein set forth. However, the method herein described will be general in its utility and application in that the ratio of length to area is employed as a variable rather than treating the area as the only variable. Expressed mathematically, $$R=pK \quad (1)$$

where R is the resistance of each element, $p$ is its resistivity, and K is the ratio of length to area.

A general procedure for carrying out the requirements is the following: The voltages for the successive colder stages are derived from the potentials of the cold junctions of the adjacent warmer stages. Required voltages for the stages are established by choosing the number of couples in the parallel network according to the relationship $$\frac{E_a}{E_{(a+1)}}=\frac{n_{T(a+1)}}{n_{ia}} \quad (2)$$

where $n_{ia}$ is the number of inner couples of the $a$ stage, and $n_{T(a+1)}$ is the total number of couples for the $(a+1)$ stage (i.e., the adjacent colder stage). For example, for stage D′ of FIG. 8 ($a=1$), assuming arm voltages of $E_{C'}=E_{D'}=60$ millivolts, and $E_{a+1}=E_{C'}=30$ millivolts, one has $$\frac{E_{D'}}{E_{C'}}=\frac{60}{30}=\frac{2}{1}=\frac{n_{TC'}}{n_{iD'}} \quad (3)$$

That is, the ratio of the total number of couples of stage C′ to the number of inner couples of D′ are inversely related to the required voltages of the respective arms. When the voltages are not small ratios, either approximate values of voltage must be accepted, or a large number of couples must be employed. In the network of FIG. 8, $n_{TC'}$ is selected as 4, which includes arms 119 through 126, and $n_{iD'}$ is set at 2, which includes arms 130 through 133, in order to realize the network for stage B′ and A. Equation 2 must be subsequently satisfied for all adjacent stages.

The second requirement is that of determining the cross sectional area of each element such that the total area of the stage to satisfy the heat pumping requirement is met, but without disturbing the requirement that the voltage across each of the stage arms remains the same. Let $K_{ia}$ and $K_{oa}$ be the length to area ratio (as defined in Equation 1), respectively, of the inner and outer arms of the $a$ stage, and $K_{Ta}$ the length to area ratio for the total stage. Also, let $I_{ia}$ and $I_{oa}$ be the current flowing in the inner and outer arms, respectively. $I_{o(a+1)}$ is the current supplied by the outer arms to the adjacent, colder stage. The value of $K_{ia}$ is given by $$K_{ia}=\frac{K_{Ta}(n_{ia}+n_{oa})}{1-\frac{(n_{oa}K_{Ta}I_{o(a+1)})}{I_{oa}K_{oa}}} \quad (4)$$

The produce $I_{oa}K_{oa}$ is found from the voltage value for the stage, and the temperature differential, $\Delta T_a$, of the stage from $$I_{oa}K_{oa}=\frac{E_a-S\Delta T_a}{p} \quad (5)$$

where $p$ and S are the resistivity and Seebeck voltage of the material, respectively. By carrying out the above procedure, starting with the cold junction, the value of $I_{o(a+1)}$ can always be specified. The number of couples $n_{ia}$ and $n_{oa}$ are known from Equation 2, and $K_{Ta}$ is the total length to area ratio required for the stage to give the desired pumping capacity. $K_{ia}$ may therefore be solved. $K_{oa}$ may next be solved from the expression $$K_{oa}=\frac{n_{oa}}{\frac{1}{K_{Ta}}-\frac{n_{ia}}{K_{ia}}} \quad (6)$$

The currents in the arms may now be computed from $$I_{oa}=\frac{(E_a-S\Delta T_a)}{pK_{oa}} \quad (7)$$

and $$I_{ia}=\frac{E_a-S\Delta T_a}{pK_{ia}} \quad (8)$$

The method, characterized by Equations 2 through 8, has been applied in actual practice to produce one preferred embodiment, using the voltages, temperature differentials, and stage pumping capacities shown in Table I below. These values represent the system requirements for achieving a maximum temperature differential using 4 stages with a 12 watt heat sink. (The electrical configuration of this system is shown in FIG. 8.)

*Table I*

| Stage | Temperature Differential | Voltage | Stage Pumping Capacity in cm.$^{-1}$ |
|---|---|---|---|
| A' | 27.4 | 23.2 | 10 |
| B' | 27.8 | 23.2 | 3.3 |
| C' | 36.7 | 30 | 1.32 |
| D' | 56.9 | 60 | 0.53 |

The results drawn from the above equations are shown in Table II below.

*Table II*

| Stage | $n_{ia}'$ | $n_{oa}'$ | $K_{ia}'$ | $K_{oa}'$ | $I_{oa}'$ | $I_{ia}'$ |
|---|---|---|---|---|---|---|
| A' | 0 | 1 | 10 | ------- | ------- | 1.70 |
| B' | 0 | 3 | 10 | ------- | ------- | 1.70 |
| C' | 1 | 3 | 59.2 | 4.14 | 5.66 | 3.96 |
| D' | 3 | 2 | 3.46 | 2.30 | 16.93 | 11.28 |

The above method is next illustrated using parameters which achieve maximum system efficiency with a three-stage system operating at a 100° C. temperature differential. The values of $E_a$, $T_a$ and $K_a$ are shown in Table III.

*Table III*

| Stage | Temperature Differential | Voltage (millivolts) | Stage Pumping Capacity |
|---|---|---|---|
| A | 25.00 | 22.8 | 16.60 |
| B | 32.14 | 26.9 | 7.50 |
| C | 42.86 | 32.7 | 3.40 |

The results drawn from the above equations are shown in Table IV:

*Table IV*

| Stage | $n_{ia}$ | $n_{oa}$ | $K_{ia}$ | $K_{oa}$ | $I_{oa}$ | $I_{ia}$ |
|---|---|---|---|---|---|---|
| A | ------- | 1 | ------- | 16.6 | 0.80 | ------- |
| B | 1 | 1 | 24.7 | 10.8 | 1.42 | 0.62 |
| C | 2 | 1 | 13.9 | 6.6 | 2.73 | 1.30 |

Since the voltages in Table III do not give ratios that are small fractions, approximate voltages may be accepted when it is desired to keep the number of couples at a minimum. Specifically, the voltages may be set equal to 30 millivolts, which gives ratios of $E_a/E_{(a+1)}=1$. Deviations of this amount do not significantly detract from system performance. This choice leads to the values of $n_{ia}$ and $n_{oa}$, shown above.

While this invention has been described in connection with certain specific embodiments thereof, it is to be understood that this is by way of illustration and not by way of limitation and the scope of this invention is defined solely by the appended claims, which should be construed as broadly as the prior art will permit.

I claim:

1. In a thermoelectric cooling system having a plurality of cooling stages and a plurality of thermoelectric cooling elements or arms in each stage and thermally connected to a heat sink and adapted to satisfy a given heat pumping requirement for a given electrical power input, the combination of a plurality of successive cooling stages wherein the cold junction temperature of each stage is made to satisfy the following relationships $$\frac{\Delta T_a}{T_{ca}^2}=\text{Const.}$$

and that $$T_{ca}=\frac{T_h}{1+\left[\frac{\Delta T_t}{NT_c}\right]\times(a)}$$

where $T_{ca}$ is the cold junction temperature of the $a$ stage, $a$ is the number of the stage, $\Delta T_a$ is the temperature differential across the $a$ stage, $T_h$ is the heat sink temperature, $T_c$ is the system cold junction temperature, $\Delta T_t=T_h-T_c$, and N is the total number of stages, whereby the operational efficiency of the system is maximized, and from which the pumping capacities, arm voltages, and temperature differentials of the stages are established.

2. In a thermoelectric cascade cooling system having a plurality of cooling stages and a plurality of thermoelectric cooling elements or arms in each stage and adapted to satisfy a given heat pumping requirement for a given electrical power input and a given voltage across each element, the combination of a number of elements in respective stages determined to satisfy the given voltage requirement according to the relationship $$\frac{E_a}{E_{a+1}}=\frac{n_{T(a+1)}}{n_{ia}}$$

where E is the voltage across each element in the $a$ stage, $E_{a+1}$ is the voltage across each element in the adjacent colder stage, $n_{T(a+1)}$ is the total number of thermoelectric couples in the $a+1$ stage, and $n_{ia}$ is the number of inner thermoelectric couples in the $a$ stage.

3. In a thermoelectric cascade cooling system having a plurality of cooling stages and a plurality of thermoelectric cooling elements or arms in each stage and adapted to satisfy a given heat pumping requirement for a given electrical power input and a given voltage across each element, the combination of a number of thermoelectric elements in respective stages having length to area ratios determined to satisfy the following relationship $$K_{ia}=\frac{K_{ta}\quad(n_{ia}+n_{oa})}{1-\frac{n_{oa}K_{ta}I_o(a+1)}{I_{oa}K_{oa}}}$$

wherein $K_{ta}$ is the length to area ratio of the $a$ stage; $K_{ia}$ is the length to area ratio of the inner arm of the $a$ stage; $I_{o(a+1)}$ is the current in the outer arm of the $a$ stage; $n_{ia}$ is the number of inner couples of the $a$ stage; and $n_{oa}$ is the number of outer couples of the $a$ stage.

4. In a thermoelectric cascade cooling system having a plurality of cooling stages thermally interconnected, the combination of a plurality of inner and outer thermoelectric cooling elements in at least one stage, said outer elements being directly connected electrically with the said inner elements and with the elements of an adjacent stage, said outer elements being characterized by having a length to area ratio with respect to the length to area ratio of said inner elements, such that the voltage across each element of said one stage is equal.

References Cited in the file of this patent

UNITED STATES PATENTS

| | | |
|---|---|---|
| 2,844,638 | Lindenblad | July 22, 1958 |
| 2,978,875 | Lackey | Apr. 11, 1961 |
| 2,986,009 | Gaysowski | May 30, 1961 |

FOREIGN PATENTS

| | | |
|---|---|---|
| 1,132,940 | Germany | July 12, 1962 |